US012581779B2

(12) United States Patent
Jang et al.

(10) Patent No.: US 12,581,779 B2
(45) Date of Patent: Mar. 17, 2026

(54) DISPLAY DEVICE AND METHOD FOR MANUFACTURING SAME

(71) Applicant: SAMSUNG ELECTRONICS CO., LTD., Suwon-si (KR)

(72) Inventors: Hyukjun Jang, Suwon-si (KR); Jaewoo Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 431 days.

(21) Appl. No.: 18/112,810

(22) Filed: Feb. 22, 2023

(65) Prior Publication Data

US 2023/0197908 A1 Jun. 22, 2023

Related U.S. Application Data

(63) Continuation of application No. PCT/KR2021/011634, filed on Aug. 31, 2021.

(30) Foreign Application Priority Data

Sep. 16, 2020 (KR) ......................... 10-2020-0119165

(51) Int. Cl.
H10H 20/85 (2025.01)
G02F 1/13357 (2006.01)
(Continued)

(52) U.S. Cl.
CPC ... H10H 20/8506 (2025.01); G02F 1/133603 (2013.01); H10H 20/8514 (2025.01); H10H 20/8582 (2025.01)

(58) Field of Classification Search
CPC .............. H10H 20/8506; H10H 20/854; G02F 1/133603; G02F 1/133614; G02F 1/133615; G02F 1/133617; G02F 1/133607
See application file for complete search history.

(56) References Cited

U.S. PATENT DOCUMENTS 8,593,590 B2 11/2013 Jung
9,831,404 B2 11/2017 Tong et al.
(Continued)

FOREIGN PATENT DOCUMENTS

CN 107331761 11/2017
CN 208284498 U * 12/2018
(Continued)

OTHER PUBLICATIONS

Korean Office Action issued Sep. 5, 2024 in corresponding Korean Patent Application No. 10-2020-0119165.
(Continued)

*Primary Examiner* — Mamadou L Diallo

(74) *Attorney, Agent, or Firm* — Nixon & Vanderhye P.C.

(57) ABSTRACT

A display device according to an example embodiment comprises: a light source package comprising light sources disposed on the mounting surface of a printed circuit board and a display panel and configured to irradiate light toward the display panel. The light source package comprises: a light conversion member configured to convert the wavelength of the light emitted from the light sources; a transparent member configured to transmit the light emitted from the light sources, and to support the light conversion member; a first package substantially surrounding the light sources and the transparent member; and a second package covering the outside of the first package, wherein the thermal conductivity of the second package is greater than the thermal conductivity of the first package.

15 Claims, 7 Drawing Sheets

(51) Int. Cl.
  *H10H 20/851* (2025.01)
  *H10H 20/858* (2025.01)

(56) References Cited

U.S. PATENT DOCUMENTS

| | | | |
|---|---|---|---|
| 10,128,418 | B2 | 11/2018 | Harris |
| 10,241,257 | B2 | 3/2019 | Ahn et al. |
| 10,297,729 | B2 | 5/2019 | Eberhardt et al. |
| 10,527,772 | B2 | 1/2020 | Sohn et al. |
| 10,586,897 | B2 | 3/2020 | Oh et al. |
| 10,608,150 | B2 | 3/2020 | Yuasa et al. |
| 11,011,685 | B2 * | 5/2021 | Yuasa ................. H10H 20/8506 |
| 11,420,412 | B2 | 8/2022 | Dubrow et al. |
| 2007/0284993 | A1 * | 12/2007 | Kim ................... G02B 19/0071 |
| | | | 257/E33.059 |
| 2012/0074456 | A1 | 3/2012 | Jin |
| 2015/0270455 | A1 | 9/2015 | Naasani et al. |
| 2018/0074372 | A1 * | 3/2018 | Takeya .............. G02F 1/133514 |
| 2018/0172894 | A1 * | 6/2018 | Sohn ................... G02B 6/0088 |
| 2018/0172900 | A1 * | 6/2018 | Ahn ..................... G02B 6/0026 |
| 2019/0081218 | A1 | 3/2019 | Dawson-Elli et al. |
| 2019/0086039 | A1 * | 3/2019 | Lee ...................... H10H 20/835 |
| 2019/0324327 | A1 * | 10/2019 | Moon .............. G02F 1/133603 |
| 2020/0161509 | A1 | 5/2020 | Dabich, II et al. |
| 2021/0033926 | A1 * | 2/2021 | Lim ................. G02F 1/133603 |
| 2021/0116754 | A1 * | 4/2021 | Park .................... G02B 6/0026 |

FOREIGN PATENT DOCUMENTS

| | | | |
|---|---|---|---|
| EP | 3330605 A1 * | 6/2018 | .......... G02B 6/0023 |
| JP | 2018-186232 | 11/2018 | |
| JP | 6966691 | 11/2021 | |
| KR | 10-2009-0090812 | 8/2009 | |
| KR | 10-2054670 | 1/2010 | |
| KR | 10-2012-0092888 | 8/2012 | |
| KR | 10-2013-0136259 | 12/2013 | |
| KR | 10-2017-0059894 | 5/2017 | |
| KR | 10-1766720 | 8/2017 | |
| KR | 10-2018-0071027 | 6/2018 | |
| KR | 10-2018-0071028 | 6/2018 | |
| KR | 10-2018-0107194 | 10/2018 | |
| KR | 10-2018-0131399 | 12/2018 | |
| KR | 10-1937241 | 1/2019 | |
| KR | 10-2020-0023440 | 3/2020 | |
| KR | 10-2098682 | 5/2020 | |

OTHER PUBLICATIONS

International Search Report dated Dec. 7, 2021 in PCT/KR2021/011634.

Written Opinion dated Dec. 7, 2021 in PCT/KR2021/011634.

Korean Office Action dated May 2, 2025 issued in Korean Patent Application No. 10-2020-0119165 and English translation, 15 pp.

* cited by examiner

DISPLAY DEVICE AND METHOD FOR MANUFACTURING SAME

CROSS-REFERENCE TO RELATED APPLICATIONS

This application is a continuation of International Application No. PCT/KR2021/011634 designating the United States, filed on Aug. 31, 2021, in the Korean Intellectual Property Receiving Office and claiming priority to Korean Patent Application No. 10-2020-0119165, filed on Sep. 16, 2020, in the Korean Intellectual Property Office, the disclosures of which are incorporated by reference herein in their entireties.

BACKGROUND

Field

The disclosure relates to a display device, and for example, to a display device having an improved heat dissipation efficiency.

Description of Related Art

In general, a display device is a device that displays a screen, and includes a monitor or a television. As the display device, a self-emissive display panel, such as an organic light-emitting diode (OLED) and a non-emissive display panel, such as a liquid crystal display (LCD) panel are used.

The disclosure relates generally to a display module and a display device, to which a non-emissive display panel is applied. A display device, to which a non-emissive display panel is applied, includes a display panel formed of a liquid crystal panel and on which a screen is displayed, and a backlight unit for supplying light to the liquid crystal panel, in which the backlight unit includes a light source module having a light source, a light guide plate for receiving light from the light source and exiting light to the display panel, and a plurality of optical sheets allowing the light passed through the light guide plate to pass therethrough. In this case, the optical sheets may include a reflective sheet, a light guide plate or a diffusion sheet, and a prism sheet, a diffusion sheet, a polarizing sheet, and the like.

A light conversion unit may be provided in the backlight unit to convert properties of light generated from the light source and supply the light. However, since the light conversion unit and the light source generate a large amount of heat, the light efficiency may be lowered, and the light source module may malfunction.

SUMMARY

Embodiments of the disclosure provide a display device having a structure for dissipating heat generated from a light source package including a light conversion member.

Embodiments of the disclosure provide a display device provided to prevent and/or reduce a light source package from being damaged by heat emitted from a light conversion member.

A display device according to an example embodiment of the disclosure includes: a display panel; and a light source package including a light source disposed on a mounting surface of a printed circuit board and configured to transmit light to the display panel, wherein the light source package includes: a light conversion member configured to convert a wavelength of light emitted from the light source; a transparent member provided to allow the light emitted from the light source to transmit therethrough and supporting the light conversion member; a first package substantially surrounding the light source and the transparent member; and a second package substantially surrounding an outer side of the first package, wherein a thermal conductivity of the second package is greater than a thermal conductivity of the first package.

The second package may include metal material.

The first package may include a first material configured to reflect at least a portion of the light emitted from the light source.

The first package may include a second material comprising different thermally conductive material from the first material and have a higher thermal conductivity than the first material.

A content ratio of the second material in the first package may be less than or equal to 20% of a total content of the first package.

The second material may be provided as boron nitride (BN).

A particle size of the BN may be greater than or equal to 50 um.

The first material may include titanium dioxide (TiO2).

The display device may further include a light guide plate provided on a rear side of the display panel, wherein the transparent member may include a first surface facing the light guide plate, a second surface disposed at a side opposite to the first surface and facing the light source, and an inserting portion disposed between the first surface and the second surface and into which the light conversion member is inserted.

The transparent member may include a first member provided with the first surface and a second member coupleable to the first member and provided with the second surface and the inserting portion.

The light conversion member may be configured to be inserted into the inserting portion, which may be open to an outside, and heated at a specified temperature, and sealed inside the transparent member.

The light source package may further include an adhesive layer disposed between the light source and the second surface and configured to allow the light source to be bonded to the second surface, wherein the adhesive layer may be a transparent material wherein light emitted from the light source may be transmitted through the adhesive layer to the transparent member.

The second package may be in contact with the printed circuit board.

The display device may further include a heat dissipation member in contact with the printed circuit board, and the second package may be in contact with the heat dissipation member.

Heat generated by the light conversion member may be emitted outside of the light source package sequentially through the transparent member, the first package, and the second package.

A display device according to an example embodiment of the disclosure includes: a display panel; and a light source package including a light guide plate provided on a rear side of the display panel and a light source disposed on a mounting surface of a printed circuit board and configured to transmit light to the display panel, wherein the light source package includes: a light conversion member configured to convert a wavelength of light emitted from the light source; a transparent member including a first surface facing the light guide plate, a second surface facing the light source, and an inserting portion disposed between the first surface and the second surface and into which the light conversion member is configured to be inserted, the transparent member being configured to allow the light emitted from the light source to transmit through the second surface by passing through the first surface, a first package substantially surrounding the transparent member and configured to dissipate heat from the transparent member; and a second package substantially surrounding the first package in a direction perpendicular to a direction in which the first surface faces and configured to dissipate heat from the first package.

In addition, the second package may have a thermal conductivity greater than a thermal conductivity of the first package.

In addition, the second package may comprise a metal material.

In addition, the first package may include a first material configured to reflect at least a portion of the light emitted from the light source and a second material comprising a different material from the first material and having a higher thermal conductivity than the first material.

A method of manufacturing a display device according to an example embodiment of the disclosure includes: preparing a transparent member including a first member and a second member coupleable to the first member and having an inserting portion into which a light conversion member for converting a wavelength of light emitted from a light source; dispensing the light conversion member into the inserting portion of the second member; annealing the second member and the light conversion member in a state in which the light conversion member is exposed to an outside; and coupling the first member to the second member such that the light conversion member is sealed inside the transparent member.

The disclosure is implemented to improve color reproducibility in a liquid crystal display device that displays an image using light incident from a backlight unit.

The disclosure is implemented to increase the heat dissipation efficiency of a light source package having a light conversion member to prevent and/or reduce the light source package from being damaged by heat generated from the light conversion member, so that the reliability of the light source package can be improved.

The disclosure is implemented to increase the heat dissipation efficiency of a light source package having a light conversion member to prevent and/or reduce the light source package from being damaged by gas volatilized in the light conversion member, so that the reliability of the light source package can be improved.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
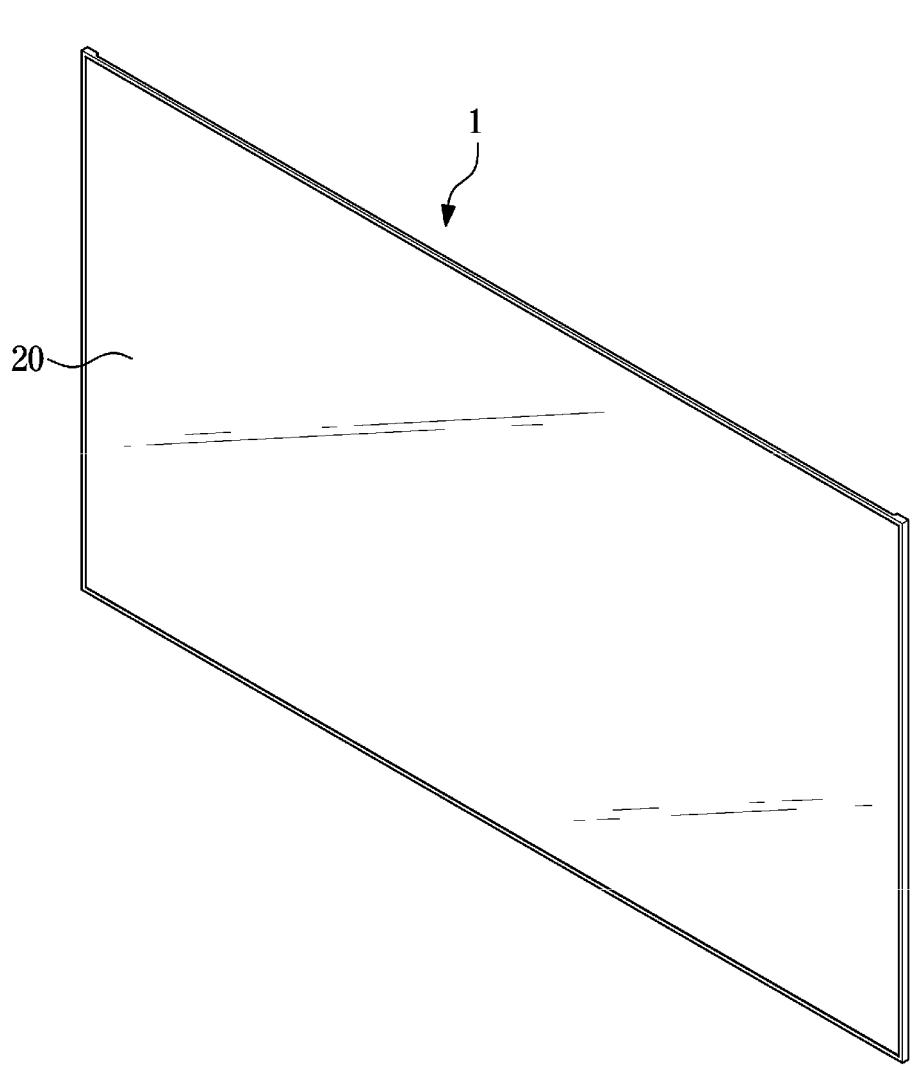
FIG. 1 is a perspective view illustrating an example display device according to various embodiments.

The various example embodiments described in the disclosure and the configurations shown in the drawings are merely examples of various embodiments of the present disclosure, and various modifications may be made to replace various aspects of the various embodiments and drawings of the present disclosure.

Further, identical symbols or numbers in the drawings of the present disclosure denote components or elements configured to perform substantially the same or identical functions.

Further, terms used herein are for the purpose of describing particular embodiments and are not intended to limit to the present disclosure. The singular form is intended to include the plural form as well, unless the context clearly indicates otherwise. It should be further understood that the terms "include," "including," "have," and/or "having" specify the presence of stated features, integers, steps, operations, elements, components, and/or groups thereof, but do not preclude the presence or addition of one or more other features, integers, steps, operations, elements, components, and/or groups thereof.

Further, it should be understood that, although the terms "first," "second," etc. may be used herein to describe various elements, the elements are not limited by the terms, and the terms are simply used to distinguish one element from another. For example, a first element could be termed a second element, and similarly, a second element could be termed a first element without departing from the scope of the present disclosure. The term "and/or" includes combinations of one or all of a plurality of associated listed items.

Hereinafter, various example embodiments according to the disclosure will be described in greater detail with reference to the accompanying drawings.

Figure 2:
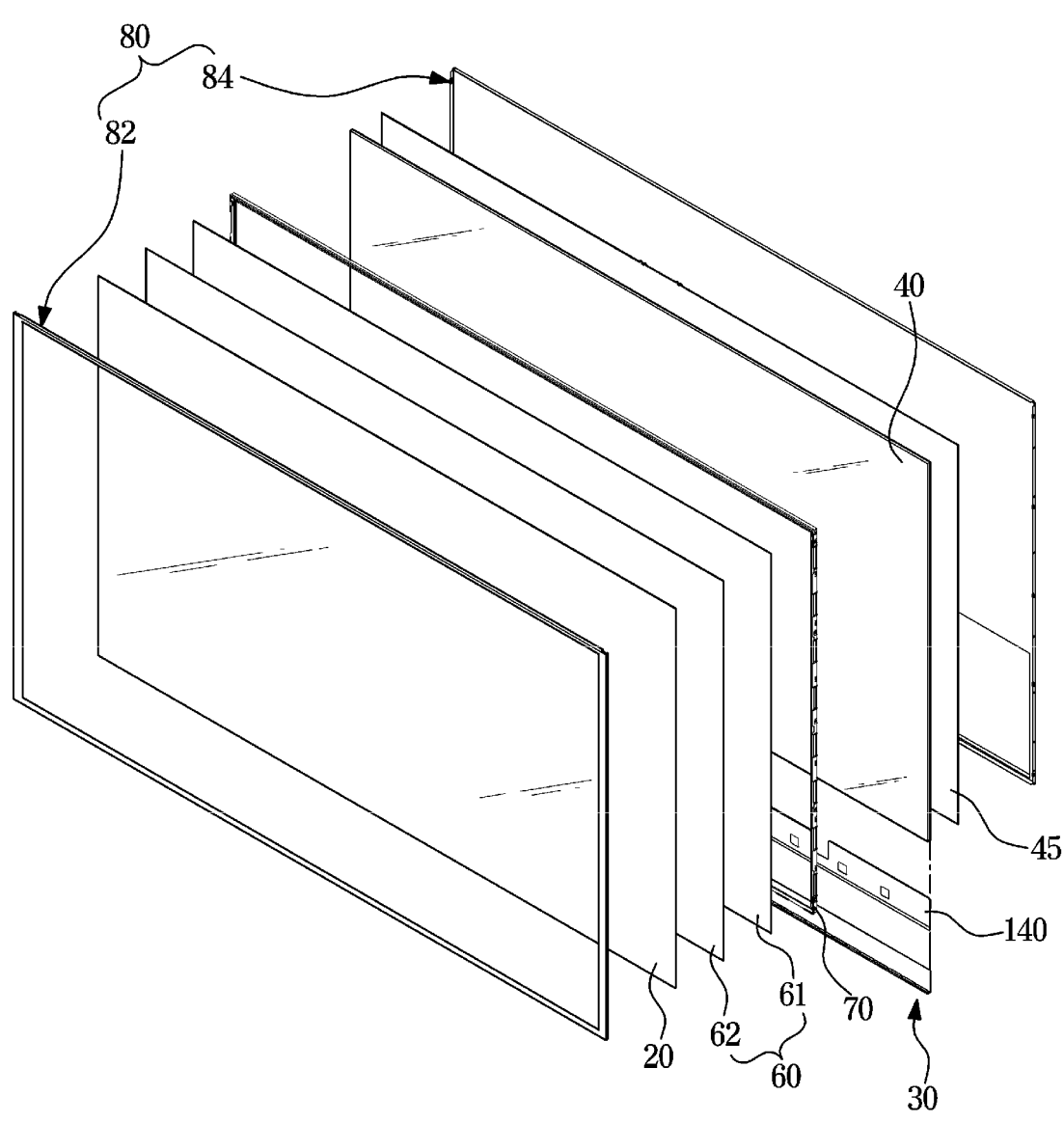
FIG. 2 is an exploded perspective view illustrating an example display device according to various embodiments.
Figure 3:
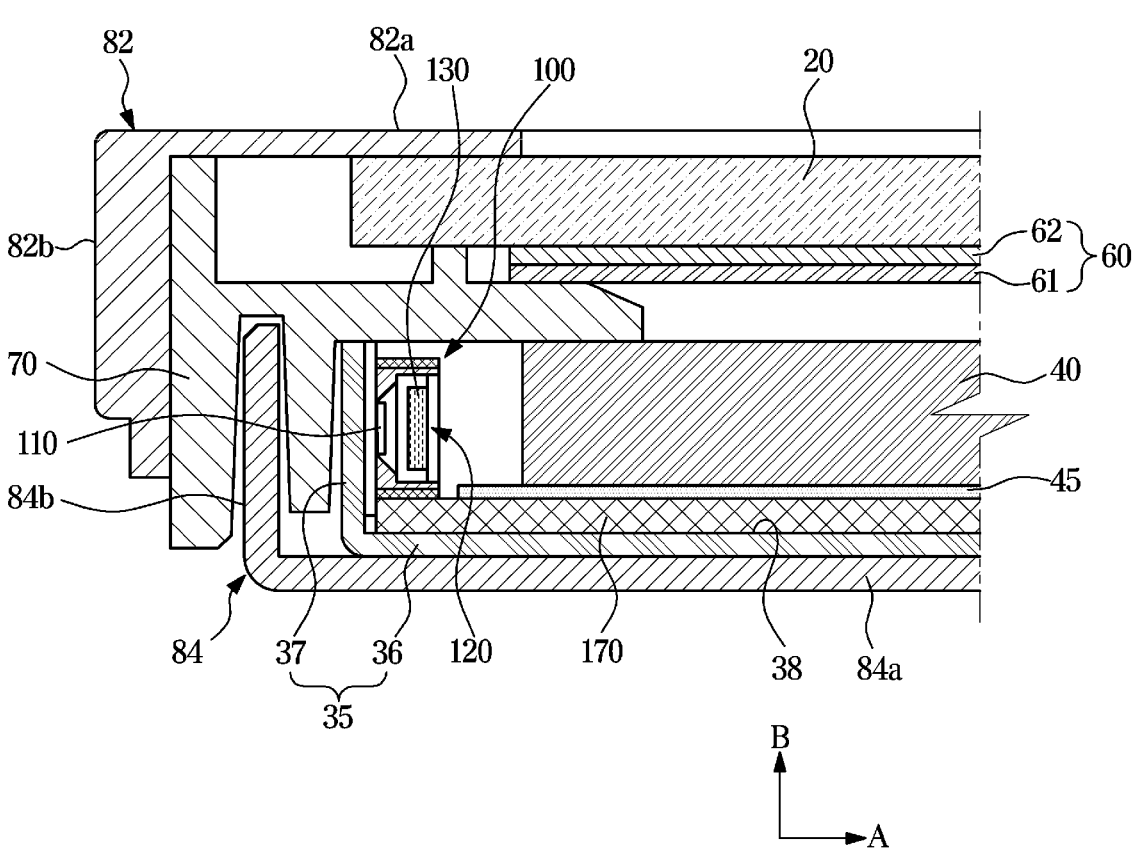
FIG. 3 is a partial cross-sectional view illustrating a display device according to various embodiments.

FIG. 1 is a perspective view illustrating an example display device according to various embodiments, FIG. 2 is an exploded perspective view illustrating the display device according to various embodiments, and FIG. 3 is a partial cross-sectional view illustrating the display device according to various embodiments.

Although the disclosure is described in relation to a flat display device 1 as an example, it is also applicable to a curved display device or a bendable display device.

The display device 1 includes a display module for displaying an image therein.

The display module includes a display panel 20, on which an image is displayed, and a backlight unit for supplying light to the display panel 20. The backlight unit may include a light source module 30 and an optical sheet 60. For example, the backlight unit may include the light source module 30 disposed behind the display panel 20, a light guide plate 40 disposed in a space between the display panel 20 and the light source module 30 for the light from the rear side to be diffused and thus transmitted to the display panel 20 positioned on the front side, an optical sheet 60 (which may include multiple sheets, e.g., sheets 61 and 62) disposed between the light guide plate 40 and the display panel 20 to change optical properties, a middle mold 70 supporting the light guide plate 40 and the light guide plate 40, and a display chassis 80 forming an exterior. The display chassis 80 includes a top chassis 82 coupled to a front side of the middle mold 70 for the display panel 20 to be kept installed in the middle mold 70 and a bottom chassis 84 coupled to a rear side of the middle mold 70 and allowing above-described light source modules 30 are disposed to be disposed on both inner sides thereof.

The light source module 30 may be disposed inside the bottom chassis 84 to transmit light toward the center of the inside of the bottom chassis 84. In the embodiment of the disclosure, the light source 30 is disposed at a lower side of the display module, but is not limited thereto, and the light source may be applied to only at least one of a lower side, a lateral side, or an upper side of the display module, and may be applied to all sides along the periphery of the display module. The light source may be applied in such an edge type display, or in a direct type display.

In the middle mold 70, the light guide plate 40, the display panel 20, and the top chassis 82 may be sequentially installed on the front side, and the bottom chassis 84 is installed on the rear side to support the respective components while allowing the display panel 20 and the bottom chassis 84 to be kept apart from each other.

The top chassis 82 includes a bezel portion 82*a* that covers an external peripheral side of a front surface of the display panel 20, and a top surface portion 82*b* that is bent at an end portion of the bezel portion 82*a* toward the rear side to cover a side surface of the middle mold 70.

The bottom chassis 84 includes a rear surface portion 84*a* that forms a rear surface of the display module and a bottom side surface portion 84*b* that extends from a periphery of the rear side portion toward the front side to be coupled to the middle mold 70.

The light source module 30 may include a light source package 100 and a printed circuit board 35.

The light source package 100 may include a light source 110 and a light conversion member 130. The light source 110 includes a light emitting device (a light emitting diode: LED). The light source package 100 may be provided in a plurality of units thereof. The plurality of light source packages 100 may be disposed to be spaced apart from each other on the printed circuit board 35. The plurality of light source packages 100 are provided to be the same as each other, and hereinafter, one light source package 100 among the plurality of light source packages 100 will be described.

The light source 110 may include a blue light emitting device. The light conversion member 130 will be described below.

The light guide plate 40 is disposed to be spaced apart from the bottom chassis 84, and the light sources 30 are disposed on both sides of a space between the light guide plate 40 and the inner surface of the bottom chassis 84, that is, at a side of the bottom side surface portion 84*b*.

The light guide plate 40 may include a reflective member 45 formed on a rear surface thereof. The reflective member 45 may be provided on the rear surface of the light guide plate 40 so that all of the light generated from the light source 30 is directed to the front. The reflective member 45 may be a reflective plate configured separately from the light guide plate 40 and disposed on the rear surface of the light guide plate 40, or may be integrally formed with the light guide plate 40. In addition, the same effect as the above may be provided by forming a reflective coating on the rear surface of the light guide plate 40.

The light guide plate 40 is provided to transmit light generated from the light source. To this end, the light guide plate 40 may be formed of a transparent resin material. In order to minimize and/or reduce deformation due to heat generated from the light source, the light guide plate 40 may be disposed to be spaced apart from the light source by a predetermined distance.

The light conversion member 130 is disposed between the light source 110 and the light guide plate 40 to change the wavelength of light transmitted from the light source 110 to the light guide plate 40.

The light conversion member 130 is provided to convert properties of light generated from the light source 110 and directed toward the light guide plate 40. In detail, the light conversion member 130 is configured to convert a wavelength of light. The light conversion member 130 may be configured such that one surface thereof faces the light source and the other surface thereof faces the light guide plate 40.

The light conversion member 130 may be formed of a quantum dot (QD) and a resin including the quantum dot.

QD will be described in greater detail. Normally, when an electron receives energy, the electron in the valence band is excited to the conduction band. After that, the electron loses energy back, dropping to the valence band. In this case, the electron radiates energy as light. QDs generate strong fluorescence in a narrow wavelength band. Depending on the size of the QD, all colors of visible light may be generated. In addition, QD generates a natural color by itself, and thus it is a material having a no loss of color and high color reproducibility. As the particle size of the QD is smaller, a shorter wavelength of light is generated, and as the particle size of the QD is larger, a longer wavelength of light is generated. QD may be a compound, such as cadmium selenide (Cdse), cadmium sulfide (Cds), cadmium telleride (Cdte), zinc selenide (ZnSe), zinc tellenide (ZnTe), zinc sulfide (ZnS) or the like.

The light source module 30 may include a heat dissipation member 170.

The heat dissipation member 170 is configured to dissipate heat generated by the plurality of light source packages 100. As will be described below, heat generated from the light source 110 and the light conversion member 130 is sequentially transferred to a first package 140 and a second package 150, and the heat dissipation member 170 is configured to dissipate heat released from the light source package 100 through the second package 150.

The heat dissipation member 170 may be positioned on a mounting surface 38 of the printed circuit board 35. The printed circuit board 35 may include a first printed circuit board 36 disposed on the rear surface of the light guide plate 40 and a second printed circuit board 37 bent from the first printed circuit board 36 and facing the side surface of the light guide plate 40.

When a direction oriented to the side surface of the light guide plate 40 is referred to as a first direction A and a direction perpendicular to the first direction A is referred to as a second direction B, the first printed circuit board 36 may be disposed to be oriented in the first direction A, and the second printed circuit board 37 may be disposed to be oriented in the second direction B.

The light source package 100 may be mounted on the second printed circuit board 37, and the heat dissipation member 170 may be positioned on the first printed circuit board 36.

The heat dissipation member 170 may be positioned on the mounting surface 38 together with the light source package 100, causing heat generated from the light source package 100 to be efficiently dissipated. The heat dissipation member 170 may be configured to cover at least a portion of the mounting surface 38 of the first printed circuit board 36.

The heat dissipation member 170 may be configured to be in contact with one side of the light source package 100 for heat dissipation of the light source package 100. Since a plurality of light source packages 100 are provided on the printed circuit board 35 in the embodiment, the heat dissipation member 170 may be provided in a longitudinal direction such that one sides of the plurality of light source packages 100 are all in contact with the heat dissipation member 170.

The heat dissipation member 170 may be disposed to be spaced apart from a path of light that passes through the light conversion member 130 and proceeds to the light guide plate 40. The heat dissipation member 170 is configured to be spaced apart from the optical path, to thereby prevent and/or reduce additional radiant heat due to the light generated from the light source package 100.

Hereinafter, the light source package 100 will be described in greater detail.

Figure 4:
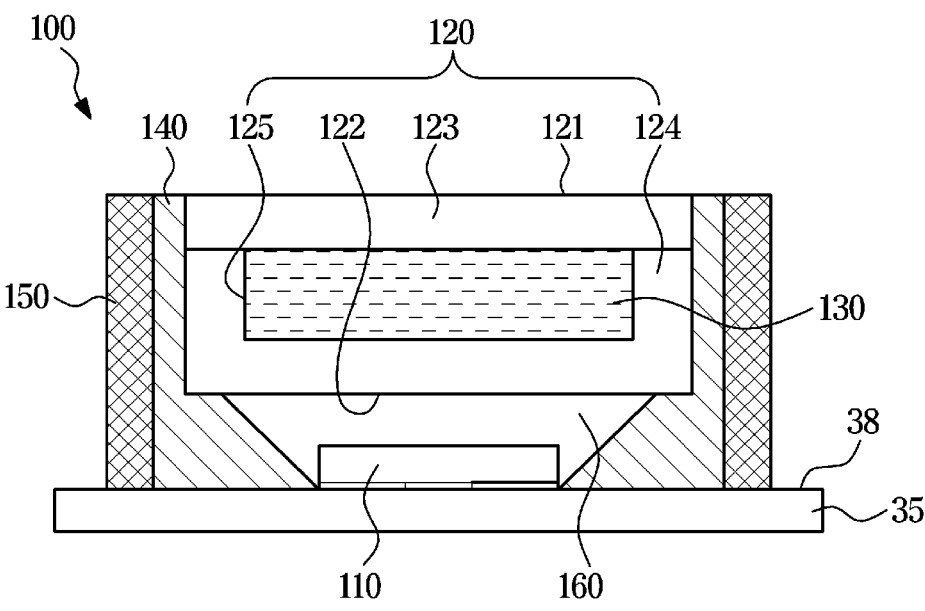
FIG. 4 is a cross-sectional view illustrating a light source package of a display device according to various embodiments.
Figure 4:
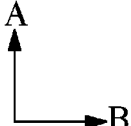

FIG. 4 is a cross-sectional view illustrating a light source package of a display device according to various embodiments.

The light source package 100 may include the light source 110 and the light conversion member 130 provided to change the wavelength of light emitted from the light source 110 as described above.

The light source package 100 may include a transparent member 120 provided to seal and support the light conversion member 130 from the outside and allow light emitted from the light source 110 to be transmitted therethrough and then directed to the light guide plate 40.

As described above, the light conversion member 130 includes a quantum dot material, and when the quantum dot material is exposed to external oxygen and moisture, photochemical properties thereof may be deteriorated.

Accordingly, the light conversion member 130 may be provided to be inserted into the transparent member 120 so that the light conversion member 130 is sealed from external oxygen and moisture.

The transparent member 120 may support the light conversion member 130 such that a predetermined (e.g., specified) separation distance is generated between the light conversion member 130 and the light source 110 to prevent and/or reduce direct contact between the light source 110 and the light conversion member 130.

This is to prevent and/or reduce photochemical properties from being changed by heat generated from the light source 110 when the light conversion member 130 is disposed in direct contact with the light source 110. As will be described below, since the light conversion member 130 is spaced apart from the light source 110, the light conversion member 130, from which heat is internally generated in a process of changing the wavelength of light, is prevented and/or reduced from changing in the property by high temperature heat due to additional heat transferred thereto from the outside.

The transparent member 120 includes a first surface 121 disposed to be oriented in the first direction A and facing the light guide plate 40, a second surface 122 disposed at a side opposite to the first surface 121 and facing the light source 110, and an inserting portion 125 disposed between the first surface 121 and the second surface 122 in the first direction A and into which the light conversion member 130 is inserted.

The first surface 121 may be provided to be directly exposed to the outside of the light source package 100. The light source 110 may be bonded to the second surface 122 by an adhesive layer 160.

As described above, in order that a predetermined separation distance is generated between the light conversion member 130 and the light source 110, a predetermined separation may be generated between the second surface 122 and the inserting portion 125.

The adhesive layer 160 may be formed of a transparent material so that light generated from the light source 110 is transmitted to the second surface 122.

The light generated from the light source 110 is introduced into the transparent member 120 by passing through the second surface 122, and then proceeds in the first direction A, passing through the light conversion member 130 and the first surface 121, thereby exiting the transparent member 120 to be directed to the light guide plate 40.

The transparent member 120 may include a first member 123 and a second member 124 coupleable to the first member 123. This is to allow the light conversion member 130 to be inserted into the transparent member 120 and seal the light conversion member 130 from the outside.

The first surface 121 may be formed in the first member 123. The second surface 122 and the inserting portion 125 may be formed in the second member 124.

The inserting portion 125 in the second member 124 may be provided to be disposed at the opposite side to the second surface 122.

The inserting portion 125 may be provided to be exposed to the outside before the first member 123 and the second member 124 are coupled to each other. Accordingly, in the manufacturing process, the transparent member 120 may be provided such that the light conversion member 130 is inserted into the inserting portion 125 of the second member 124 and then the first member 123 is coupled to the second member 124, allowing the inserting portion 125 to be blocked from the outside. The manufacturing process of the transparent member 120 will be described in detail below.

In the case of a conventional display device, a quantum dot sheet for changing the wavelength of light transmitted from a light source is included in order to improve the color reproducibility of the light transmitted from the light source.

The quantum dot sheet is disposed at a predetermined distance from the light source inside the display device to be prevented/reduced from being thermally deformed by heat generated from the light source, and is disposed together with an additional protective film to prevent and/or reduce moisture from penetrating from the outside.

Accordingly, the color reproducibility of the display device is increased and the performance of the display device is improved, but the thickness of the display device increases due to the arrangement of the quantum dot sheet inside the display device, and the quantum dot sheet and the protective film of the quantum dot sheet cause the production cost to rise.

In order to address the issue, a display device including a light source module in which a light conversion member having quantum dots is directly installed on a light source package instead of using a quantum dot sheet has been developed. However, as the light conversion member having quantum dots is installed on the light source package, there is another issue that heat generated from the LED chip, heat generated from the quantum dot itself, and external moisture may lower the reliability of the configuration having quantum dots.

In order to address the above-described issue, the display device 1 according to an embodiment of the disclosure is provided to improve the reliability against the penetration of the heat generated from the light source 100 and external air and moisture by inserting the light conversion member 130 having quantum dots into the transparent member 120 without having a quantum dot sheet.

However, in a process in which the wavelength of light generated from the light source 110 is converted in the light conversion member 130, light loss occurs and light energy is converted to thermal energy, causing heat to be internally generated in the light conversion member 130, which may lead to an issue that the transparent member 120 sealing the light conversion member 130 may be damaged by the high temperature heat generated in the light conversion member 130.

The display device 1 according to an embodiment of the disclosure may, in order to address the above-described issue, include a first package 140 and a second package 150 provided to efficiently dissipate heat from the transparent member 120.

That is, the light source package 100 may be provided to allow the high temperature heat transferred from the light conversion member 130 to the transparent member 120 to be efficiently dissipated to the outside of the transparent member 120 through the first package 140 and the second package 150, to thereby prevent and/or reduce the transparent member 120 from being damaged by high temperature heat.

The first package 140 may be provided to surround the transparent member 120 in the second direction B. For example, the first package 140 may be provided to surround the transparent member 120, the light source 110, and the adhesive layer 160 in the second direction B.

The second package 150 may be provided to surround the first package 140 in the second direction B.

Accordingly, heat transferred to the transparent member 120 may be sequentially transferred to the first package 140 and the second package 150.

The thermal conductivity of the second package 150 may be provided to be greater than that of the first package 140. Accordingly, when heat is transferred from the transparent member 120 to the first package 140, the heat transferred to the first package 140 may be efficiently transferred to the second package 150 by the transfer of heat according to a difference in thermal conductivities therebetween.

Therefore, since the high temperature heat transferred from the transparent member 120 may be immediately transferred to the second package 150 without remaining in the first package 140, the heat of the transparent member 120 may be efficiently dissipated.

In the case of the conventional technology, a housing for packaging a transparent member is formed of a single material, and thus the high temperature heat transferred from the transparent member to the housing remains in the housing, and thus the heat of the transparent member is inefficiently dissipated, but according to the embodiment of the disclosure, the configuration for packaging the transparent member 120 includes a plurality of configurations each having a different thermal conductivity, and thus the transparent member 120 may be efficiently dissipated.

The second package 150 may be formed of a metal material having high thermal conductivity. The second package 150 may be provided as a metal member surrounding an edge of the first package 140 in the second direction B.

The second package 150 may be provided to be in contact with the above-described heat dissipation member 170.

Accordingly, the heat transferred to the second package 150 may be easily transferred to the outside of the light source package 100, and thus efficient heat dissipation may be possible.

The first package 140 may be provided such that the transparent member !20 supporting the light source 110 and the light conversion member 130 is disposed inside the first package 140.

The first package 140 may be configured to absorb heat generated from the light source 110 and the transparent member 120. To this end, the first package 140 may be configured to be in direct contact with the transparent member 120 and the light source 110. In addition, the package housing 130 may be formed of a material having a high heat transfer rate.

In addition, as the first package 140 is arranged to surround the light source 110, light directed to the first package 140 that is emitted from the light source 110 may be reflected to the transparent member 120.

That is, the first package 140 may be formed of a material that efficiently reflects light.

To this end, the first package 140 includes a first material provided to efficiently reflect light emitted from the light source 110 and a second material formed of a different component from the first material and having higher thermal conductivity than the first material.

The first material is a material having high reflectance and may include titanium dioxide ($TiO_2$) or the like.

The second material is a material having high thermal conductivity and may include boron nitride (BN) or the like.

The first package 140 may include a third material in addition to the first and second materials that facilitates mixing of the first and second materials and allows the first package 140 to be easily dispensed in a resin state and cured, as will be described below. The third material may include silicon (Si) or the like.

Unit particles of boron nitride of the second material may have a size approximately 50 μm or larger. Accordingly, the first package 140 may be formed in a state in which unit particles of boron nitride in the first material are connected to each other.

Therefore, when high temperature heat is transferred from the transparent member 120 to the first package 140, the high temperature heat is efficiently transferred through the unit particles of boron nitride connected to each other, and thus easily transferred to the second package 150 surrounding the first package 140.

The content ratio of the second material in the first package 140 may, for example, be provided to be 20% or less of the total amount of the material of the first package 140.

For example, when the first package 140 is formed of a resin containing particles, such as boron nitride, titanium dioxide, and silicon, the boron nitride may be combined in a content ratio of 20% or less in the resin forming the entire first package 140.

The first package 140 is provided to radiate heat from the transparent member 120 while reflecting the light emitted from the light source 110 to the transparent member 120 as described above, but as the content of the second material increases, the amount of light reflection of the light source package 100 decreases, and thus the light efficiency of the light source package 100 is lowered.

Hereinafter, a process of manufacturing the transparent member 120 into which the light conversion member 130 is inserted will be described in greater detail.

Figure 5:
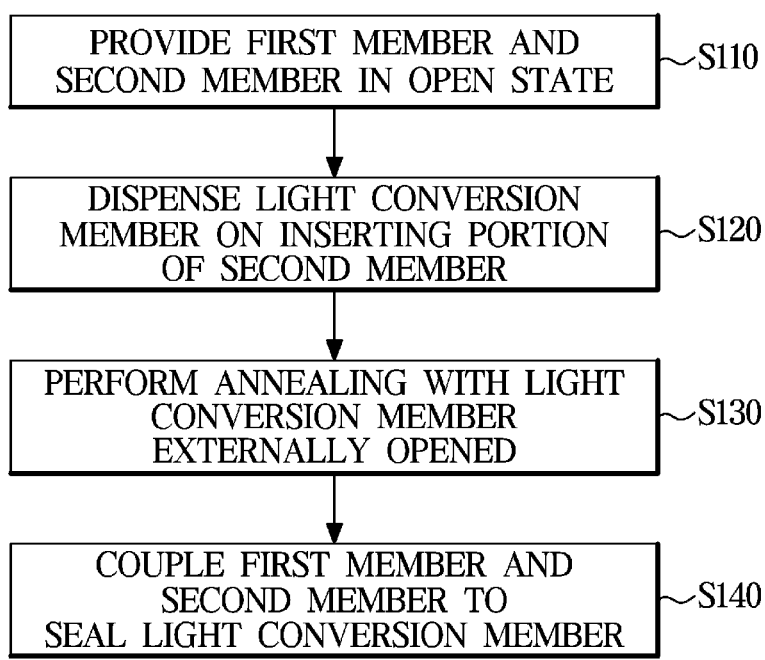
FIG. 5 is a flowchart illustrating an example method of manufacturing a transparent member of a display device according to various embodiments.

FIG. 5 is a flowchart illustrating an example method of manufacturing a transparent member of a display device according to various embodiments.

As described above, in a process of converting the wavelength of light generated from the light source 110 in the light conversion member 130, light loss occurs and the light energy is converted into thermal energy, so that heat is internally generate in the light conversion member 130, which causes some materials forming the light conversion member 130 to be volatilized by the high temperature heat and thus gas may be generated.

In this case, the generated gas is sealed inside the transparent member 120, but as the amount of gas generated increases, a high pressure is formed inside the transparent member 120, which may cause the transparent member 120 to be damaged.

Accordingly, there is a need for a manufacturing method of removing volatile gas from the light conversion member 130 before sealing the light conversion member 130 in the transparent member 120.

A method of manufacturing a transparent member 120 of a display device 1 according to an embodiment of the disclosure is as follows.

A first member 123 and a second member 124 of the transparent member 10, which are not coupled to each other, are provided (S110). With the first member 123 and the second member 124 not coupled, an inserting portion 125 may be exposed to the outside.

A resin including quantum dots is dispensed in the inserting portion 125 to form a light conversion member 130 (S120).

The manufacturing environment when dispensing the resin including quantum dots may be provided in a vacuum or nitrogen atmosphere to prevent and/or reduce the quantum dots from being deteriorated by external exposure.

Rather than immediately coupling the first member 123 to the second member 124, an annealing process of providing high-temperature heat is performed while the light conversion member 130 is exposed to the outside (S130).

The environment of the process may also be provided in a vacuum or nitrogen atmosphere to prevent and/or reduce the quantum dots from being deteriorated due to being exposed to the outside.

A high temperature of about 150 degrees may be provided to the light conversion member 130 for about 30 minutes.

Accordingly, the gas that may be volatilized at a high temperature in the light conversion member 130 may be volatilized before sealing.

The first member 123 and the second member 124 are coupled to each other to seal the light conversion member 130 (S140).

The first member 123 and the second member 124 may be welded to seal the light conversion member 130.

Hereinafter, a process of manufacturing the light source package 100 will be described in greater detail.

Figure 6:
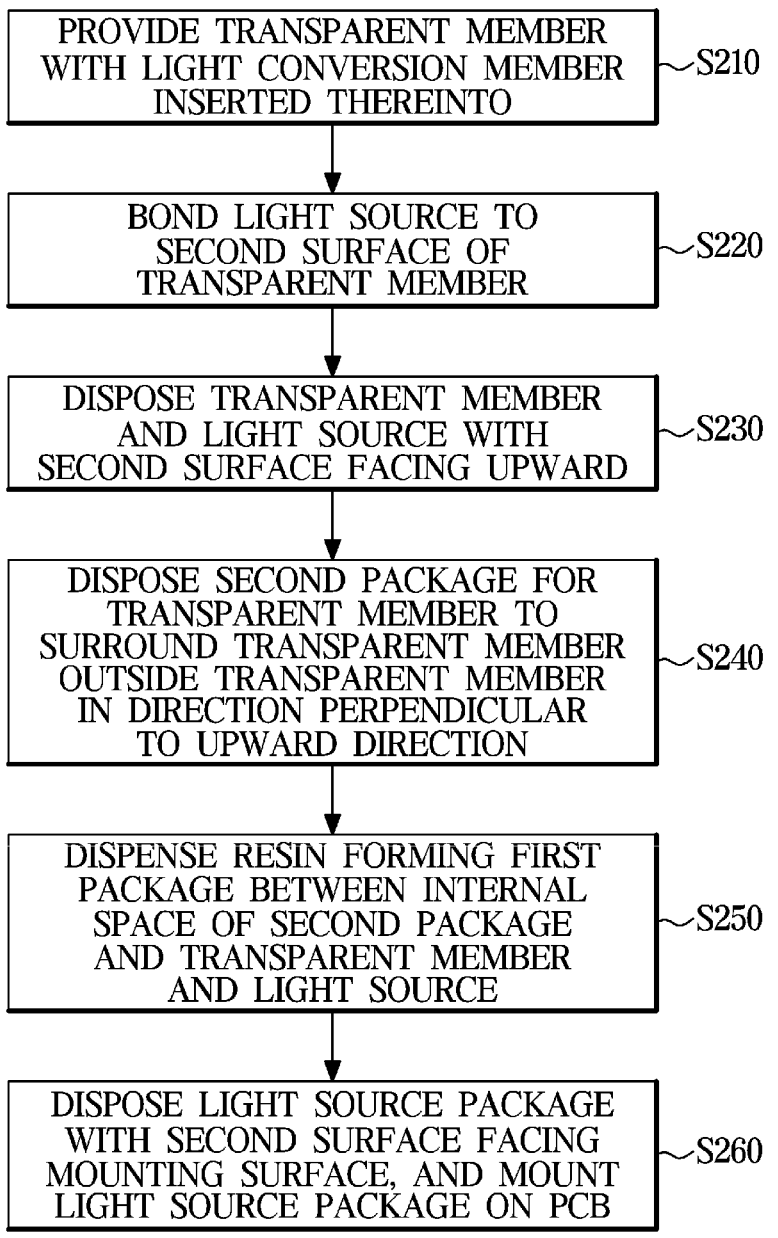
FIG. 6 is a flowchart illustrating an example method of manufacturing a light source package of a display device according to various embodiments.

FIG. 6 is a flowchart illustrating an example method of manufacturing a light source package of a display device according to various embodiments.

As described above, a transparent member 120 with a light conversion member 130 inserted thereinto is provided (S210).

A light source 110 is bonded to a second surface 122 (S220). In detail, the second surface 122 is arranged to face upward, and the light source 110 is placed on the second surface 122 and bonded.

An adhesive layer 160 may be disposed between the light source 110 and the second surface 122, and the light source 110 may be bonded to the second surface 122 by the adhesive layer 160.

In a state in which the second surface 122 is disposed to face upward (S230), a second package 150 is disposed on the outside of the transparent member 120 in the second direction B (S240).

The second package 150 may be provided in a shape of a square pillar formed by bending a metal plate to have a hollow. The transparent member 120 may be set to be disposed at the center of the square pillar of the second package 150.

In this case, a predetermined distance may be formed between the second package 150 and the transparent member 120 in the second direction B. In addition, since the light source 110 is disposed on the second surface 122 of the transparent member 120, the second package 150 may be disposed outside the light source 110 in the second direction B.

A resin forming the first package 140 is dispensed into an inner space formed between the light source 110 and the transparent member 120 and the inner surface of the second package 150 (S250).

Accordingly, the first package 140 may be formed between the light source 110 and the transparent member 120 and the inner surface of the second package 150. Through such a process, the first package 140 may be sequentially disposed on the outside of the transparent member 120 and the second package 150 may be disposed on the outside of the first package 140.

As the first package 140 is cured, the light source package 100 may be manufactured and then the light source package 100 may be disposed such that the second surface 112 faces the mounting surface 38 so that the light source package 100 may be mounted on a mounting surface 38 (S260).

In this case, since the light source 110 is disposed on the second surface 112 as described above, the light source 110 may be directly electrically coupled to the mounting surface 38.

Hereinafter, a display device 1 according to an embodiment of the disclosure will be described. Since the configuration other than a light source module 30 described below is the same as or similar to that of the display device 1 according to the embodiment of the disclosure described above, the same description will be omitted.

Figure 7:
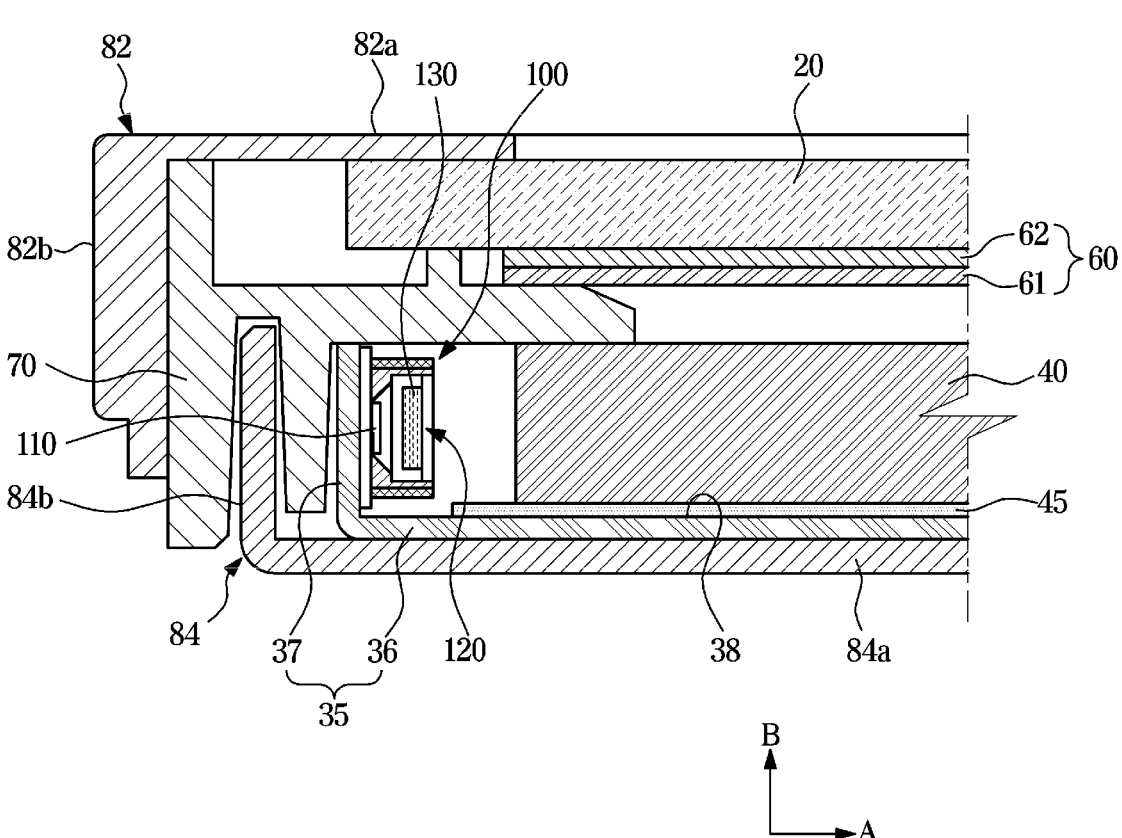
FIG. 7 is a partial cross-sectional view illustrating a display device according to various embodiments.

FIG. 7 is a partial cross-sectional view illustrating a display device according to various embodiments.

The second package 150 may be provided to directly radiate heat to the outside air without being in contact with the heat dissipation member 170.

In addition, the second package 150 is not limited thereto, and the second package 150 may be in direct contact with the bottom chassis 84 or connected to an additional connecting member (not shown) connecting the bottom chassis to the second package 150 to thereby easily dissipate heat transferred to the second package 150.

That is, the heat transferred to the second package 150 may be transferred to the outside in various ways.

Although few embodiments of the disclosure have been shown and described, the above embodiments are for illustrative purposes, and it would be appreciated by those skilled in the art that changes and modifications may be made in these embodiments without departing from the principles and scope of the disclosure, including in the claims and their equivalents. It will also be understood that any of the embodiment(s) described herein may be used in conjunction with any other embodiment(s) described herein.

What is claimed is:

1. A display device comprising:
a display panel; and
a light source package including a light source disposed on a mounting surface of a printed circuit board and configured to transmit light to the display panel,
wherein the light source package includes:
a light conversion member, comprising light conversion material, configured to convert a wavelength of light emitted from the light source;
a transparent member, comprising substantially transparent material, configured to allow the light emitted from the light source to be transmitted therethrough, at least a part of the transparent member being positioned between the light source and the light conversion member to support the light conversion member;
a first package substantially surrounding the light source and the transparent member; and
a second package substantially surrounding an outer side of the first package,
wherein a thermal conductivity of the second package is greater than a thermal conductivity of the first package.

2. A display device comprising:
a display panel; and
a light source package including a light source disposed on a mounting surface of a printed circuit board and configured to transmit light to the display panel,
wherein the light source package includes:
a light conversion member, comprising light conversion material, configured to convert a wavelength of light emitted from the light source;
a transparent member, comprising substantially transparent material, configured to allow the light emitted from the light source to be transmitted therethrough and to support the light conversion member;
a first package substantially surrounding the light source and the transparent member; and
a second package substantially surrounding an outer side of the first package,
wherein a thermal conductivity of the second package is greater than a thermal conductivity of the first package, and wherein the second package comprises a metal material.

3. The display device of claim 1, wherein the first package includes a first material configured to reflect at least a portion of the light emitted from the light source.

4. The display device of claim 3, wherein the first package includes a second material comprising a different material from the first material and having a higher thermal conductivity than the first material.

5. The display device of claim 4, wherein a content ratio of the second material in the first package is less than or equal to 20% of a total content of the first package.

6. The display device of claim 5, wherein the second material comprises boron nitride (BN).

7. The display device of claim 6, wherein a particle size of the BN is greater than or equal to 50 um.

8. The display device of claim 5, wherein the first material comprises titanium dioxide (TiO2).

9. A display device comprising:
a display panel;
a light source package including a light source disposed on a mounting surface of a printed circuit board and configured to transmit light to the display panel,
wherein the light source package includes:
a light conversion member, comprising light conversion material, configured to convert a wavelength of light emitted from the light source;
a transparent member, comprising substantially transparent material, configured to allow the light emitted from the light source to be transmitted therethrough, at least a part of the transparent member being positioned between the light source and the light conversion member to support the light conversion member;
a first package substantially surrounding the light source and the transparent member; and
a second package substantially surrounding an outer side of the first package,
wherein a thermal conductivity of the second package is greater than a thermal conductivity of the first package; and
a light guide plate provided on a rear side of the display panel,
wherein the transparent member includes a first surface facing the light guide plate, a second surface disposed at a side opposite to the first surface and facing the light source, and an inserting portion disposed between the first surface and the second surface and into which the light conversion member is inserted.

10. The display device of claim 9, wherein the transparent member includes a first member provided with the first surface and a second member coupleable to the first member and provided with the second surface and the inserting portion.

11. The display device of claim 10, wherein the light conversion member is configured to be inserted into the inserting portion, in a state of being open to an outside, and heated at a specified temperature, and sealed inside the transparent member.

12. The display device of claim 9, wherein the light source package further includes an adhesive layer disposed between the light source and the second surface and configured to bond the light source to the second surface,
wherein the adhesive layer comprises a transparent material so that light emitted from the light source is capable of being transmitted through the adhesive layer to the transparent member.

13. The display device of claim 1, wherein the second package is in contact with the printed circuit board.

14. The display device of claim 1, further comprising a heat dissipation member in contact with the printed circuit board, and
the second package is in contact with the heat dissipation member.

15. The display device of claim 1, wherein heat generated by the light conversion member is emitted outside of the light source package through the transparent member, the first package, and the second package.

* * * * *